(12) United States Patent
Pham

(10) Patent No.: US 6,999,952 B1
(45) Date of Patent: Feb. 14, 2006

(54) LINEAR ASSOCIATIVE MEMORY-BASED HARDWARE ARCHITECTURE FOR FAULT TOLERANT ASIC/FPGA WORK-AROUND

(75) Inventor: Christopher H. Pham, Milpitas, CA (US)

(73) Assignee: Cisco Technology, Inc., San Jose, CA (US)

( * ) Notice: Subject to any disclaimer, the term of this patent is extended or adjusted under 35 U.S.C. 154(b) by 844 days.

(21) Appl. No.: 09/837,882

(22) Filed: Apr. 18, 2001

(51) Int. Cl.
    G06F 12/00 (2006.01)
(52) U.S. Cl. .......................... 706/33; 706/15; 711/108; 326/39; 327/103; 365/49
(58) Field of Classification Search ................ 706/33, 706/15; 711/108; 326/39; 327/103; 365/49
    See application file for complete search history.

(56) References Cited

U.S. PATENT DOCUMENTS

| | | | |
|---|---|---|---|
| 3,777,129 A * | 12/1973 | Mehta | 716/4 |
| 4,918,618 A * | 4/1990 | Tomlinson, Jr. | 706/25 |
| 5,467,427 A * | 11/1995 | Kothari et al. | 706/25 |
| 5,680,470 A * | 10/1997 | Moussa et al. | 382/119 |
| 5,875,347 A * | 2/1999 | Watanabe et al. | 712/1 |
| 6,009,418 A * | 12/1999 | Cooper | 706/15 |
| 6,167,558 A | 12/2000 | Trimberger | 716/16 |
| 6,771,623 B1 * | 8/2004 | Ton | 370/331 |

OTHER PUBLICATIONS

☐☐Artificial Neural Network Based Multiple Fault Diagnosis In Digital Circuits by A. A. Al-Jumah and T. Arslan, Circuits and Systems, 1998, Proceedings of the 1998 IEEE, vol. 2, May 31 Jun. 3, 1998, pp.: 304-307, vol. 2.*

(Continued)

*Primary Examiner*—Wilbert L. Starks
*Assistant Examiner*—Mai T. Tran
(74) *Attorney, Agent, or Firm*—Campbell Stephenson Ascolese LLP

(57) ABSTRACT

A programmable logic unit (e.g., an ASIC or FPGA) having a feedforward linear associative memory (LAM) neural network checking circuit which classifies input vectors to a faulty hardware block as either good or not good and, when a new input vector is classified as not good, blocks a corresponding output vector of the faulty hardware block, enables a software work-around for the new input vector, and accepts the software work-around input as the output vector of the programmable logic circuit. The feedforward LAM neural network checking circuit has a weight matrix whose elements are based on a set of known bad input vectors for said faulty hardware block. The feedforward LAM neural network checking circuit may update the weight matrix online using one or more additional bad input vectors. A discrete Hopfield algorithm is used to calculate the weight matrix W. The feedforward LAM neural network checking circuit calculates an output vector $a^{(m)}$ by multiplying the weight matrix W by the new input vector $b^{(m)}$, that is, $a^{(m)} = wb^{(m)}$, adjusts elements of the output vector $a^{(m)}$ by respective thresholds, and processes the elements using a plurality of non-linear units to provide an output of 1 when a given adjusted element is positive, and provide an output of 0 when a given adjusted element is not positive. If a vector constructed of the outputs of these non-linear units matches with an entry in a content-addressable memory (CAM) storing the set of known bad vectors (a CAM hit), then the new input vector is classified as not good.

19 Claims, 4 Drawing Sheets

OTHER PUBLICATIONS

Specifications and FPGA Implementation of a systol Hopfield-type associative memory by I. Z. Mihu, R. Brad, and M. Breazu,☐☐Neural Networks, 2001. Proceedings 01, pp. 228-233, vol. 1.*

Fault Diagnosis of Analog Circuits with Tolerances Using Artificial Neural Networks by Ying Deng, yigang He, and Yichuang Sun IEEE 2000.*

Fault Tolerance of Feedforward Artificial Neural Networks—A Framework of Study by Pravin Chandra, IEEE 2003.*

S. Y. Kung, "Digital Neural Networks," Chapter 2, *Fixed-Weight Associative Memory Networks*, pp. 42-72, Prentice Hall, Jan. 1988.

* cited by examiner

LINEAR ASSOCIATIVE MEMORY-BASED HARDWARE ARCHITECTURE FOR FAULT TOLERANT ASIC/FPGA WORK-AROUND

BACKGROUND OF THE INVENTION

1. Field of the Invention

The present invention generally relates to electronic circuits, specifically, programmable logic units such as application-specific integrated circuits (ASICs) and field-programmable gate arrays (FPGAs), and more particularly to an improved method of overcoming design flaws in such programmable logic circuits, using software work-arounds in place of the defective portions of the circuits, but only for those input vectors affected by the fault.

2. Description of the Related Art

Modern electronic circuits use many different types of logic components or processing units to carry out numerous functions. In the early years of the semiconducting industry, these components were integrated circuits (ICs) with narrowly limited functionalities. Early small-scale integration ICs contained a few logic gates (AND gates, OR gates, NAND gates, NOR gates, XOR gates, etc.) amounting to a few dozen transistors. These gates are combined in Boolean fashion to implement particular logic circuits. Medium-scale integration increased the range of integrated logic available to counters and similar logic functions, and large-scale integration packed even larger logic functions, such as the first microprocessors, into a single chip. The current era of very large-scale integration (VLSI) offers complex processing and control capabilities with well over a million transistors on a single piece of silicon.

While many digital logic ICs became standard components which could be used to construct a variety of different microelectronic systems, there was a clear desire to provide more customized or tailor-made ICs for the electronics industry. As CMOS process technology has improved, and transistors continue to get smaller, it has become easier for engineers to design larger ICs that may be adapted to a customer's specific needs; these types of ICs are referred to as application-specific integrated circuits (ASICs).

An ASIC, like a conventional integrated circuit, includes an IC package (typically having a pin-grid array, or PGA), with the silicon chip (die) mounted in a cavity under a sealed lid. The physical size of a silicon die varies from a few millimeters on a side to over one inch on a side, but the size of an ASIC is often measured instead by the number of logic gates or transistors that the IC contains. Very large ASICs typically have hundreds of thousands of gates.

ASICs are used for a wide variety of applications, such as children's electronic toys, telecommunications, and data processing. ASICs are also known as customer-specific integrated circuits (CSICs). Some ASICs which are specific to a particular application, but are sold to many different system vendors similar to a standard component, are commonly referred to as application-specific standard part (AS-SPs). ASICs can be built using customized circuits at every level, which is the most time-consuming and complicated approach, or be built using gate arrays, standard cells, or programmable logic devices. In a fully-customized ASIC, the designer uses no pretested and precharacterized cells for the design, and all layers of the chip (including the "mask" layers) are designed to unique specifications. In programmable ASICs, all of the logic cells are predesigned and none of the mask layers are customized.

These programmable ASICs include a plurality of logic elements and associated interconnect resources that are easily programmed by the end-user to implement user-defined logic operations. They can be programmed using a personal computer (PC) or similar workstation, with appropriate software and a device programmer. Therefore, unlike fully-customized ASICs that require a protracted layout procedure and an expensive fabrication process to implement a user's logic operation, a programmable ASIC may be utilized to implement the logic operation in a relatively quick and inexpensive manner.

There are generally two types of programmable ASICs: the programmable logic device (PLD), and the field-programmable gate array (FPGA). Gate arrays are made up of base cells that contain a varying number of transistors and resistors according to the vendor's specifications. Using a cell library (of gates, registers, etc.) and a macro library (for more complex functions), the customer designs the chip, and the vendor's software generates the masks that connect the transistors. An FPGA is usually larger and more complex than a PLD.

A PLD may also be programmed at the customer's site. PLDs use fusible links which are blown in order to open a circuit line, or "antifuse" technology which allows the circuit lines to be fused together. PLD techniques include programmable logic arrays (PLAs) and programmable array logic (PAL), which provide different configurations of AND and OR gates. Unlike gate arrays, which require the final masking fabrication process, PLDs are easily programmable in the field. Although memory devices generally are not considered a PLD, since they generally have no logic functions, some programmable storage chips such as programmable read-only memory (PROM) may be considered a PLD if it contains program code rather than just data.

It is very common in the ASIC/FPGA design process that only a pseudo-comprehensive test is performed for a given hardware design. The pseudo-comprehensive test basically uses a set of test vectors that provide the best coverage for the functional testing of the circuit under test. Normally, to test an n-bit input circuit, 2n test vector combinations are required; however, if the n bits are divided into two groups of m bits and (n−m) bits, then it requires only 2n−m+2 m<2n test vectors to test all the functionality. This scheme, however, cannot guarantee 100% coverage. In reality, when the ASIC is in the field, it may encounter some new inputs that are never tested in the factory. The new inputs may or may not cause the circuit to malfunction depending on how well the circuit was designed.

If a design flaw exists, there are generally two approaches to correcting the problem, hardware or software. A common hardware approach to providing fault tolerance in FPGAs is to relocate the logic portion assigned to a defective configurable logic block (CLB) into a spare or other unused CLB, and to reroute signals from the defective CLB to the spare/unused CLB. One problem with this approach is that a user typically does not know which CLB of a particular FPGA will be defective, and usually generates configuration data intended for a defect-free device. If the user then attempts to program an FPGA containing a defective CLB, the programmed FPGA will not perform as intended. Therefore, the user must either discard the FPGA, or the user must repeat the place-and-route process with a modified device description indicating the location of the defective CLB. Because each target FPGA may have a defective CLB in a different location, this approach potentially requires different configuration data for every device implementing the user's logic operation. This approach puts a heavy burden on the user who must potentially repeat the place-and-route operation for each FPGA and supply many PROM configurations.

Other hardware approaches also implement redundant circuitry in the FPGA, which is generally undesirable as it requires blocks of the circuit to be reserved and possibly go unused throughout the life of the FPGA. Since it is not easy to fix an ASIC/FPGA at the hardware level, software work-arounds are called for as an alternative until the new chip is re-designed. When the hardware fails to perform its functionality, software can be used to perform the same task, and this software is referred to as a software work-around. The software work-arounds can be keyed to a static table of faulty vectors.

When a software work-around is employed to account for a new bug, the system performance usually deteriorates at least three orders in magnitude ($10^3$) because of the gap between hardware and software speeds. The software work-around can never provide the same level of performance as the initial architecture embedded in the ASIC. At the system software level, instructions are typically executed on a scale of microseconds. At the hardware (sub-micron) level, instructions are performed on a scale of nanoseconds. This difference can bottleneck instruction throughput and have an immense (negative) impact on the overall performance of the ASIC.

This performance latency is exacerbated by the fact that, oftentimes, it is really not necessary to execute the software work-around. ASICs tend to use regularly-shaped, standard cells or blocks to simply construction and design. When a hardware block is faulty, the fault sometimes affects only a small range of input vectors (i.e., input data) of the block. Nevertheless, if the block is faulty, then all vectors to that block will be rerouted for software processing. The system will accordingly have to wait on the software work-around for all input vectors, even though some of those vectors may not be bad. It would, therefore, be desirable to devise an improved method of utilizing software work-arounds in an ASIC or FPGA, which would ensure appropriate handling of bad vectors while still retaining the benefit of the speed of the original hardware design for at least some input vectors of the faulty block. It would be further advantageous if the method allowed new faulty vectors to be dynamically discovered and the software work-around mechanism appropriately updated.

SUMMARY OF THE INVENTION

It is therefore one object of the present invention to provide an improved programmable logic unit, such as an application-specific integrated circuit (ASIC) or field-programmable gate array (FPGA).

It is another object of the present invention to provide such a programmable logic circuit which utilizes an efficient software work-around mechanism for faulty hardware blocks.

It is yet another object of the present invention to provide a fault-tolerant ASIC/FPGA which can identify potentially bad input vectors from a faulty block and handle those bad vectors using a software work-around, while still using the faulty block for good vectors.

The foregoing objects are achieved in a programmable logic unit generally comprising a plurality of interconnected hardware blocks, one of them being faulty, a feedforward linear associative memory (LAM) neural network checking circuit which classifies input vectors to the faulty hardware block as either good or not good, and selection means which is responsive to the feedforward LAM neural network checking circuit classifying a new input vector as not good, for blocking a corresponding output vector of the faulty hardware block, enabling a software work-around for the new input vector, and accepting an output vector from a software work-around input as the output vector of the programmable logic circuit. In an illustrative embodiment, the selection means includes a software work-around enable signal output of the feedforward LAM neural network checking circuit, and a multiplexer having two inputs respectively receiving the output vector from said faulty hardware block and the output vector from said software work-around, and a select line which is connected to the software work-around enable signal output of said feedforward LAM neural network checking circuit.

The feedforward LAM neural network checking circuit has a weight matrix whose elements are based on a set of known bad input vectors for said faulty hardware block. The feedforward LAM neural network checking circuit may update the weight matrix online using one or more additional bad input vectors. A feedforward LAM algorithm is used to calculate the weight matrix W (an N row by K column matrix, having elements $w_{ij}$) according to the equation $$w_{ij} = \sum_{m=1}^{M} (2z_i^{(m)} - 1)^2$$

where $z_1^{(m)}$ is the set of known bad binary vectors (i.e., only a 0 or 1), M is the number of bad input vectors in the set of known bad input vectors, i is the row locator representing the particular bad vector, and j is the column locator representing the bit location. The feedforward LAM neural network checking circuit calculates an output vector $a^{(m)}$ by multiplying the weight matrix W by the new input vector $b^{(m)}$, that is, $a^{(m)} = Wb^{(m)}$ adjusts elements of the output vector $a^{(m)}$ by its respective thresholds $\theta_i$ according to the equation $$\theta i = -1/2 \sum_{j=1}^{K} w_{ij}$$

where K is the total number of bits in a vector, and processes the elements using a plurality of non-linear units to provide an output of 1 when a given adjusted element is positive, and provide an output of 0 when a given adjusted element is not positive. If a vector constructed of the outputs of these non-linear units matches with an entry in a content-addressable memory (CAM) storing the set of known bad vectors (a CAM hit), then the new input vector is classified as not good. The feedforward LAM neural network checking circuit classifies input vectors to the faulty hardware block as either good or not good prior to the faulty hardware generating its output vector corresponding to the new input vector.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present invention is directed to a method of providing fault-tolerance in a programmable logic circuit, such as an application-specific integrated circuit (ASIC) or field-programmable gate array (FPGA), by utilizing an efficient software work-around for faulty hardware in the programmable logic circuit. The hardware architecture envisioned by the invention allows for certain input vectors to be handled by the original hardware design while only faulty cases trigger the software work-around. In the preferred embodiment, this architecture is derived from a feedforward linear auto-associative memory neural network as discussed further below.

A generalized artificial neural network (ANN) with a feedforward linear associative memory (LAM) model has one layer of input neurons and one layer of output neurons, with a feedforward weight connection. A background discussion of this type of ANN can be found in the book "Digital Neural Networks," by S. Y. Kung (1993). Feedforward models are one of two types of fixed-weight associative memory systems (the other being the feedback type). The feedforward type may use linear and non-linear associative memory. The feedforward type may also use the Hopfield network where feedback connections are adapted to facilitate recurrent operations. Conventional feedforward LAM models are designed to retrieve patterns in one shot. In contrast, a feedback network does not yield the correct pattern in a single forward pass. It is particularly advantageous to retrieve a pattern in a one-shot calculation for the present invention, because there is a severe restriction on the amount of time that is feasible for the algorithm to decide whether the original hardware result should be used or whether the software word-around should be used. In the present invention, an ANN discrete Hopfield network algorithm is used to design checking circuitry which may be trained to identify potentially bad vectors in the programmable logic circuit.

Figure 1:
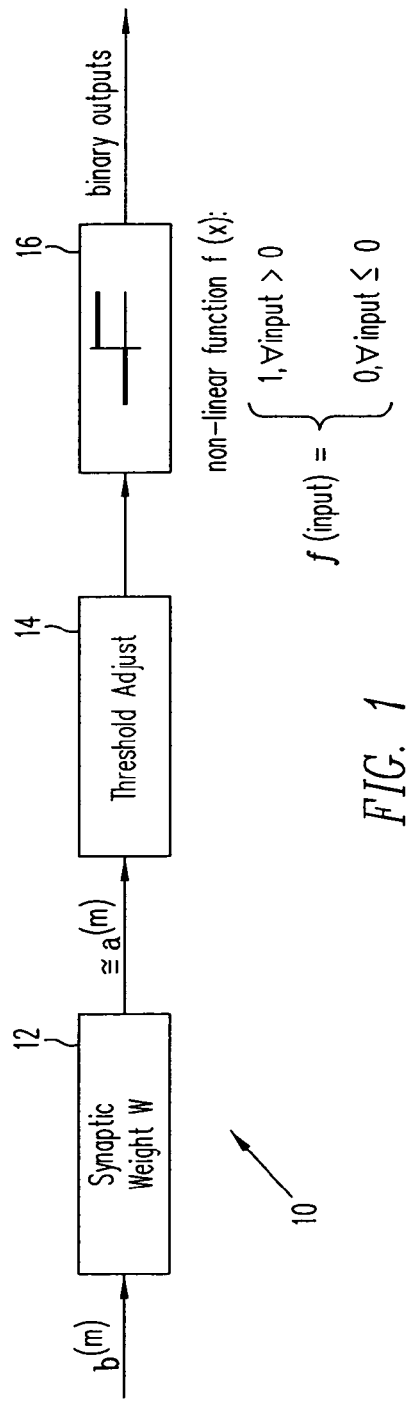
FIG. 1 is a diagrammatic representation of an artificial neural network (ANN) with a feedforward linear associative memory (LAM) model constructed in accordance with the present invention.

The integrity of an n-bit input vector is identified as "good" or "bad" based on the n-bit patterns stored in the network (auto-association). As shown in FIG. 1, the LAM model 10 is derived from a set of input/output pattern pairs $\{b^{(m)}, a^{(m)}\}$, that is, $b^{(m)}$ represents the input vector, and $a^{(m)}$ represents the output vector. In this high-level diagram, weight matrix 12 represents the feedforward synaptic weights. The auto-association application of this model has the size of the input vector $b^{(m)}$ equal to the size of the output vector $a^{(m)}$.

The input vectors (which may or may not be faulty) can be expressed as:

$$b^{(m)}=[b_1^{(m)},b_2^{(m)}, \ldots, b_k^{(m)}]^T$$

where $[\ldots]^T$ is the transpose of the matrix or vector, and k is the number of bits in a vector (for example, for a 4-bit system, if sets 0100 and 0110 are faulty, then $b^0=\{0,1,0,0\}$, and $b^1=\{0,1,1,0\}$). Similarly, the output containing only faulty vectors may be expressed as:

$$a^{(m)}=[a_1^{(m)},a_2^{(m)}, \ldots, a_k^{(m)}]^T.$$

The feedforward topology has the input cells $b^{(m)}$ located at the input layer and the output vectors $a^{(m)}$ at the output layer.

The main application of LAM circuit 10 is to identify (i.e., retrieve) the output information based on either full or partial information of the input. In other words, after the ASIC/FPGA design engineer already knows some of the bad vectors in set $a^{(m)}$, then these bad vectors can be used to train the LAM checking circuitry to classify other new inputs into two classes: the first class contains all good vectors that will not trigger the hardware fault, the second class contains all other bad (definitely faulty) or suspicious (potentially faulty) vectors that will or may cause the hardware to malfunction. The new input vectors are thus a set of test vector $b^{(m)}$ in which $b_n^{(m)} \epsilon b^{(m)}$ may be identical or partially identical to the set $a^{(m)}$ that was used to construct weight matrix 12.

For digital electronics applications, the weighting can be built from a known set of bad vectors. Each element $w_{ij}$ of the weight matrix W is calculated according to the equation:

$$w_{ij} = \sum_{m=1}^{M} (2a_i^{(m)} - 1)(2b_j^{(m)} - 1)$$

where M is the number of bad vectors in the set of known bad vectors, and $a_j=b_j$. The identification (i.e., retrieve) process calculates the output vector $a^{(m)}$ by multiplying the weight matrix W by the input vector $b^{(m)}$, that is:

$$a^{(m)}=Wb^{(m)}.$$

To produce the binary-value (0 or 1) output, the elements of the vector $Wb^{(m)}$ are first adjusted by their respective thresholds $\theta_i$:

$$\theta i = -1/2 \sum_{j=1}^{K} w_{ij}$$

This procedure is carried out by threshold adjustment circuit 14.

To complete the calculation, each element is processed by a non-linear unit 16. If the adjusted value is positive, then the output of non-linear unit will be 1; otherwise, it will be 0.

Figure 2:
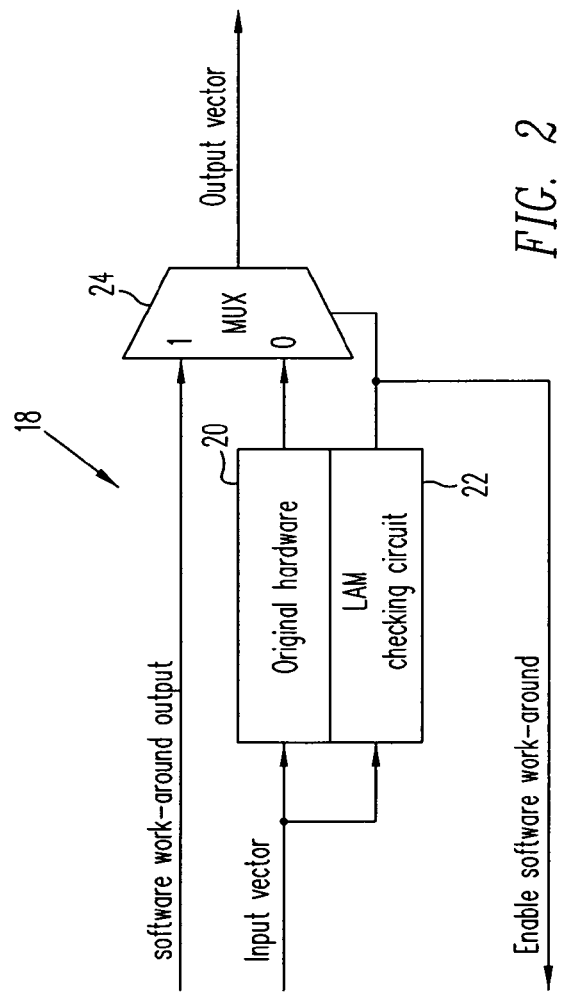
FIG. 2 is a high-level block diagram of one embodiment of a hardware model for realizing the ANN feedforward LAM in accordance with the present invention.

With reference now to FIG. 2, there is depicted a hardware model 18 for realizing the ANN feedforward LAM algorithm in accordance with the present invention. In this embodiment, the input vector is received by the original hardware block 20 of the programmable logic unit 18, and is also received by the LAM checking circuit 22. Initially it is assumed that the input vector is a good vector and will therefore be handled by the original hardware but, at the same time, feedforward LAM checking circuit 22 attempts to identify whether this current input vector contains bad data. If a bad vector is identified in the allowed time, then LAM checking circuitry 22 outputs a control signal which blocks the output from the original hardware 20 using a multiplexer 24, and signals the system to proceed with the software work-around and accept only the work-around output. Multiplexer 24 could be symbolic in this context, because the output of the software work-around may never physically have a path into the hardware.

The output of multiplexer 24 is determined by the select signal from LAM checking circuitry 22. If LAM checking circuit 22 cannot classify the input vector to the bad-vector group, then the selection signal will be asserted "low" to use the output from original hardware 20. If the checking circuit successfully classifies the input vector as a bad vector, then the selection signal will be asserted "high" to use the output from the software work-around. At the same time, the selection also serves as an enable signal to allow the work-around to start its process. However, an operating system (such as Linux, Windows, Unix, etc.) can check an external signal, such as an interrupt signal, before spending time on the work-around and also use the same checking signal to assure that it can use its own software result.

Figure 3:
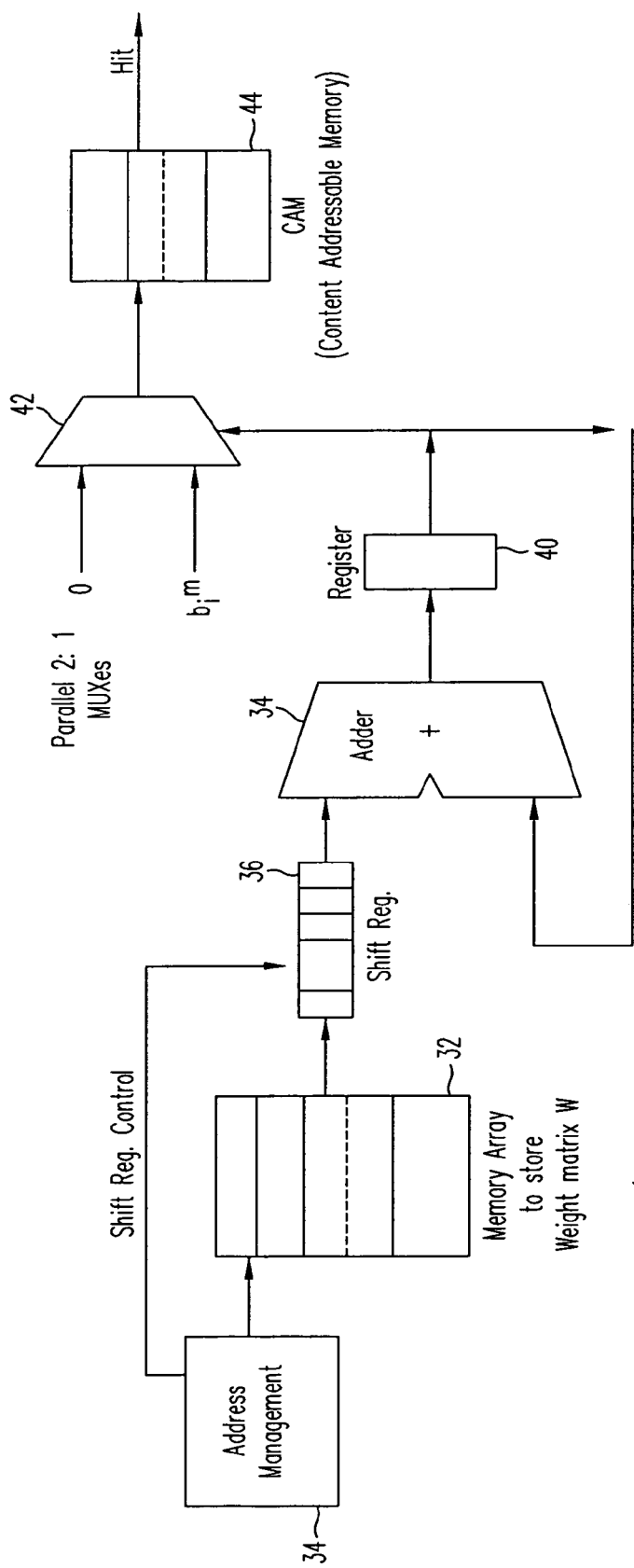
FIG. 3 is a high-level schematic diagram of one embodiment of an offline training circuit for use with the LAM checking circuit of the present invention.

An illustrative implementation of an offline training circuit 30 for the feedforward LAM checking hardware is shown in FIG. 3. For offline training, it is assumed that the ASIC/FPGA engineer already knows the bad vectors. Initially, the LAM checking hardware block may be designed based on these known bad vectors only, without worrying whether more bad vectors may be discovered in the future. The weight matrix W in the offline scheme never changes. If more bad vectors are found, the engineer can redesign the circuit again. In such a case, the new weight matrix is calculated offline to replace the old W, e.g., using flash-based FPGA technology. The actual hardware on the chip board is never changed but its contents (i.e., the design) can be changed by electronically erasing the old matrix and replacing it with the new vectors.

The design of offline training circuit 30 includes a memory array 32, an address memory management circuit 34, an n-bit shift register 36, an adder circuit 38, a register 40, a multiplexer 42, and a content addressable memory (CAM) 44. Memory array 32 is used to store the weight matrix W. Address memory management circuit 34 allows access to all rows of weight matrix 32. This address management also controls shift register 36 in the process of calculating θ1. The number of bits n in shift register 36 corresponds to the number of columns of matrix W. Adder circuit 38 calculates the threshold $\theta_{i=-\frac{1}{2}\Sigma w_{ij}}$, $\forall j \in [1,K]$. Multiplexer 42 performs the non-linear function processing, i.e., if the input from register 40 is greater than zero, then the output of multiplexer 42 is $b_i^{(m)}$, or else the output is 0 (the calculation of $a^{(m)} = Wb^{(m)}$). Register 40 is used to store the value from the current calculation while allowing the next calculation to begin (which might result in a change in the output of multiplexer 34). There are actually n number of 2:1 single-bit multiplexers 42 to calculate all columns of W at the same time. CAM 44 is used to identify the stored bad vectors $a^{(m)}$ with the output from multiplexer 42. A hit in CAM 44 (i.e., a match between one of the entries in CAM 44 and a vector constructed from the outputs of the multiplexers 42) indicates that a potentially bad vector has been retrieved. This line serves as the select signal for multiplexer 24 in FIG. 2.

The same general hardware architecture for the offline training circuit may be upgraded to perform online training. In on-line training, the LAM checking circuit is self-trained and reconfigures itself as more bad vectors are found. The on-line training process requires dynamic configuration of the weight matrix W. The offline architecture is still reusable in this portion with an addition to the front end of a special circuit to perform the calculation of the weight matrix W. The weight matrix W is stored dynamically online every time a new bad vector is found. In addition, the $a^{(m)}$ vectors are updated online in another content addressable memory unit, as discussed further below.

Figure 4:
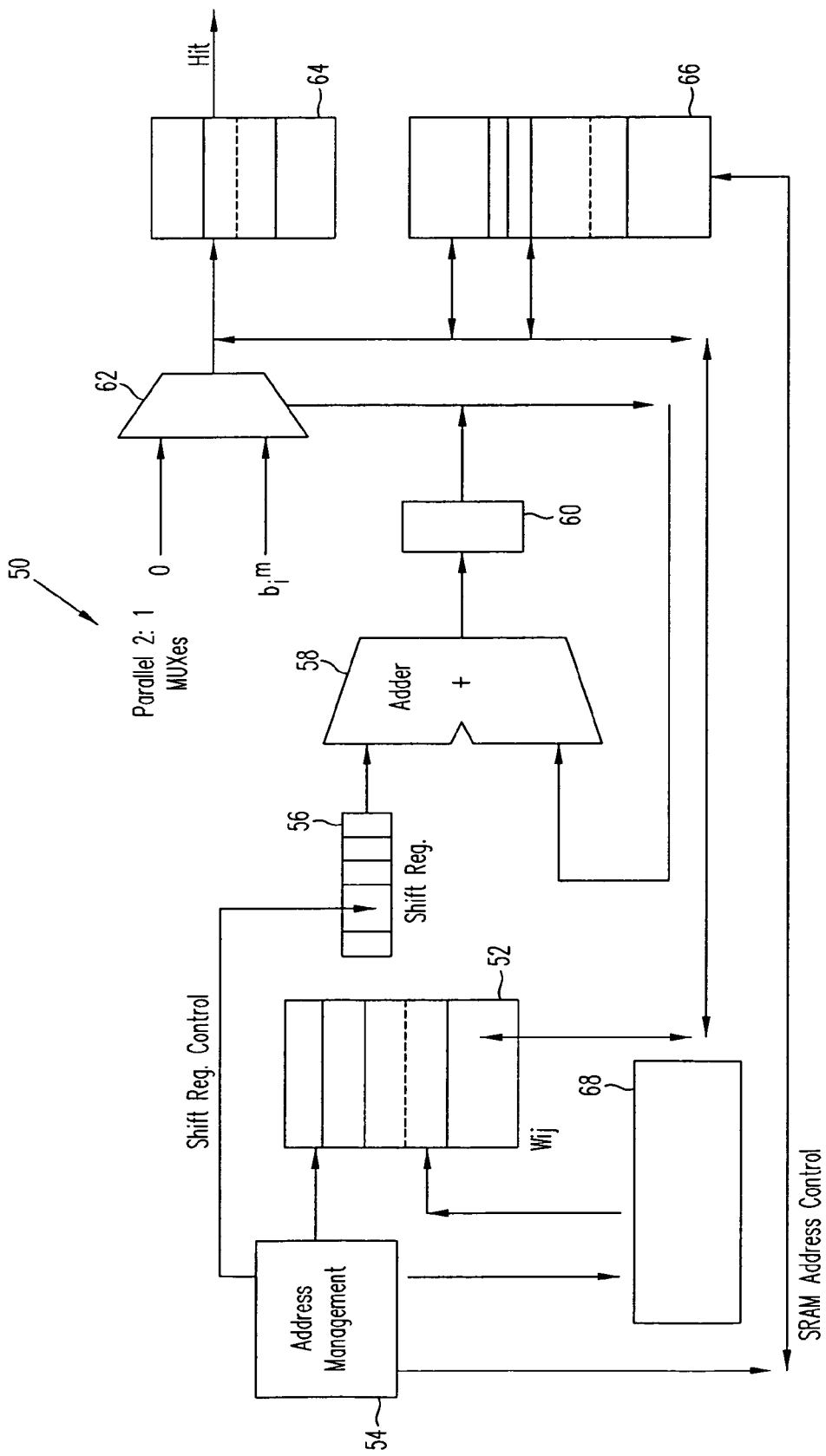
FIG. 4 is a high-level schematic diagram of one embodiment of an online training circuit for use with the LAM checking circuit of the present invention.

FIG. 4 illustrates one embodiment of an online training circuit 50 constructed in accordance with the present invention. Online training circuit 50 again includes a memory array 52, an address memory management circuit 54, an n-bit shift register 56, an adder circuit 58, a register 60, a multiplexer 62, and a CAM 64. Each of these components serves a function similar to the corresponding component in offline training circuit 30. The bad vectors are stored in the CAM database. Every time a bad vector is found, it is added to the CAM database. SRAM or flash memory 66 can be used for this purpose. It is straight forward to update the SRAM. Since SRAM is not a permanent space, its content is initialized at system start-up. Flash memory is preferred. Appropriate circuitry is used to first store the content of the flash in a temporary placeholder such as an SRAM swap space, then adding the new vector to the temporary space, and finally rewrite everything back to the flash memory. One alternative is to use flash memory to download the content to the SRAM every time the system boots up. All the updating therefore is recorded into the SRAM. From time to time, the updating circuitry can transfer the new database from the SRAM to the flash space.

Figure 5:
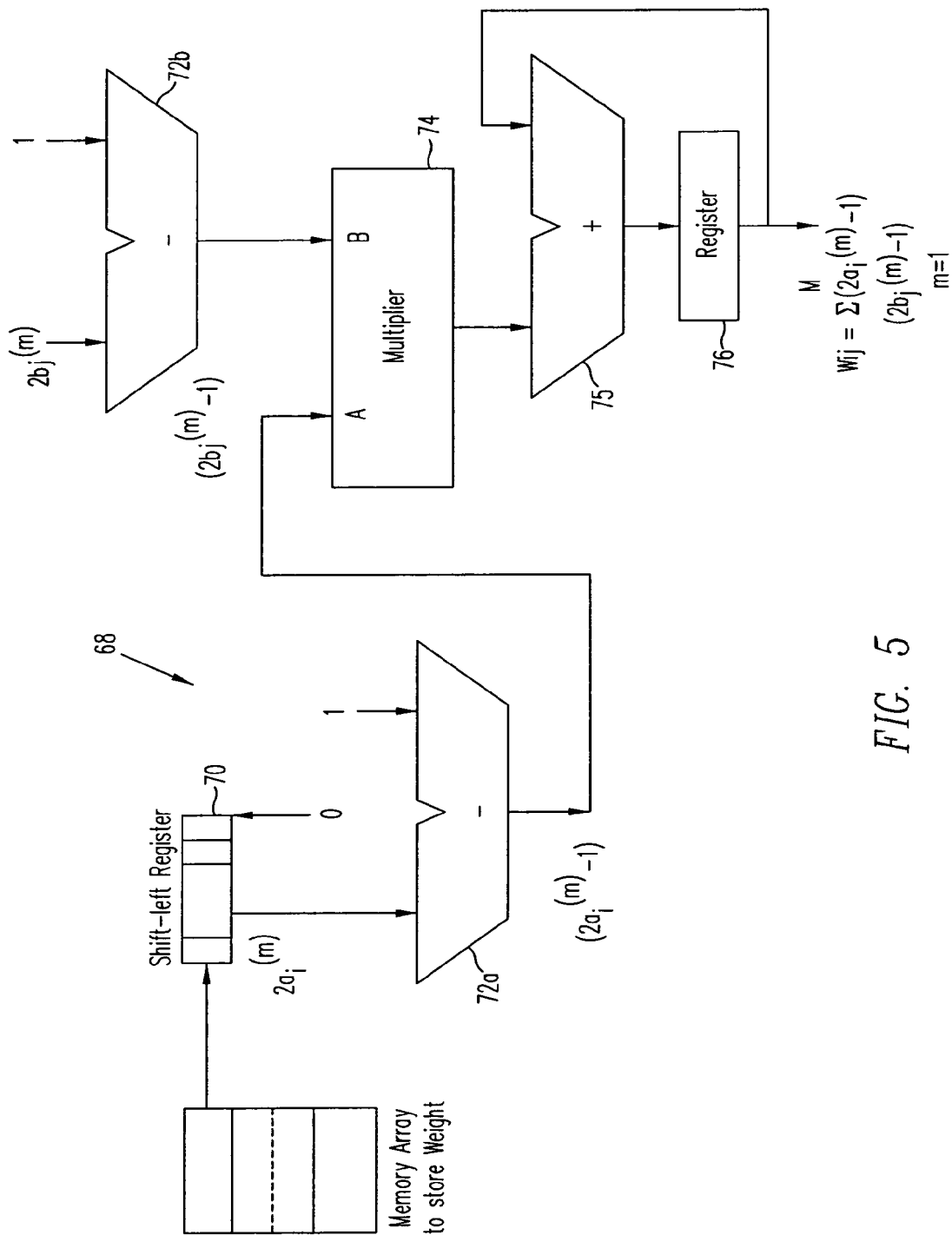
FIG. 5 is a high-level schematic diagram of one embodiment of a circuit for recalculating a weight matrix used by the online training circuit of FIG. 4.

The weight matrix W memory updating architecture is basically the same as that used for CAM 64. The new calculated W has to be stored temporarily in an SRAM space, then stored to the W permanent placeholder. Address management unit 54 may be designed to allow the same SRAM to be used as the placeholders for both CAM 64 and W memory 52. Proper memory mapping will prevent the overwriting of the data. Online updating circuit 50 includes a hardware block 68 for recalculating the weight matrix W. From the formula given above for the matrix, it can be seen that the elements of the $a^{(m)}$ vector must be multiplied by 2, and then 1 subtracted from this product. As shown in FIG. 5, these steps can be performed using a shift register 70 to shift left the content of each element by one bit. The result is then subtracted by using a subtractor 72a. The entire quantity $(2a_i^{(m)}-1)$ is multiplied to the entire quantity $(2b_j^{(m)}-1)$ created the same way by subtracting 1 from $2b_j^{(m)}$ using subtractor 72b. All elements are summed together to produce the desired W matrix using an adder 75 and a register 76 which feeds the prior value back to adder 75.

The add-in checking mechanism allows the original hardware architecture to perform its intended task at the silicon speed. When the checking mechanism finds a bad vector, the software operating system takes effect. For example, in the case where the original hardware is abandoned totally, the software can start to calculate immediately without waiting for the response from the checking block. The checking hardware requires time t1 to perform the shift process to calculate $2b_n^{(m)}$, time t2 to calculate the threshold, time t3 to adjust the threshold using the non-linear unit, time t4 to access the CAM to find out whether this is a bad vector, and then time t5 to respond to the MUX to either accept the original output or use the software work-around. Roughly estimating the times t1, t2, t3, t4, t5 at a worst case silicon speed, it takes a total of about 8 ns+20 ns+8 ns+20 ns+8 ns=64 ns (the overall time for determining that the vector is bad is less than 60 ns). This time frame is much less than that of the software speed (at microseconds, or thousands of nanoseconds). Some drawbacks may exist due to possible time-outs, when the checking circuit cannot arrive at an absolute decision (i.e., no convergence found). It is safer to use the software work-around anyway, which can be resolved by employing a time-out circuit.

If the ASIC/FPGA is designed with some re-configurable hardware redundancy then it is a straightforward matter to put the work-around into practice. The ANN feedforward LAM hardware architecture discussed herein is easily implemented in the hardware redundancy block, but can also be implemented in an add-on FPGA.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A circuit for checking the integrity of one or more input vectors to a digital hardware block, comprising:
 a memory array containing a weight matrix having elements which are based on a set of known bad input vectors for the digital hardware block;
 means for selectively classifying future input vectors to the digital hardware block as either good or not good, using the weight matrix, wherein the classifying means classifies a given input vector as good or not good in less than 60 ns;
 an SRAM array;
 a content-addressable memory for storing the known bad input vectors; and
 address management means for using said SRAM to update both the content-addressable memory and the weight matrix.

2. The circuit of claim 1 further comprising means for creating the weight matrix using a feedforward linear associative memory neural network.

3. The circuit of claim 1 wherein said classifying means classifies as not good both future input vectors which are definitely faulty and future inputs vectors which are potentially faulty.

4. The circuit of claim 1 wherein the weight matrix W is created using a discrete Hopfield network algorithm according to the equation $$w_{ij} = \sum_{m=1}^{M} (2a_i^{(m)} - 1)(2b_j^{(m)} - 1)$$

where $a^{(m)}$ is the set of known bad vectors, $a_i = b_j$, M is the number of bad input vectors in the set of known bad input vectors, i is a row locator representing a particular bad vector, and j is a column locator representing a bit location.

5. The circuit of claim 4 wherein said classifying means includes means for calculating an output vector $a^{(m)}$ by multiplying the weight matrix W by the new input vector $b^{(m)}$, that is, $a^{(m)} = Wb^{(m)}$.

6. The circuit of claim 5 wherein said classifying means further includes means for adjusting elements of the output vector $a^{(m)}$ by its respective thresholds $\theta_i$ according to the equation $$\theta i = -1/2 \sum_{j=1}^{K} w_{ij}$$

where K is the total number of bits in a vector.

7. The circuit of claim 6 wherein said classifying means includes a plurality of non-linear units which respectively processes the adjusted elements such that, when a given adjusted element is positive, an output of the corresponding non-linear unit is 1 and, when a given adjusted element is not positive, the output of the corresponding non-linear unit is 0.

8. The circuit of claim 1 further comprising means for blocking an output of the digital hardware block corresponding to a new input vector, and accepting an output of a software work-around corresponding to the new input vector, in response to said classifying means classifying the new input vector as not good.

9. The circuit of claim 1 further comprising means for updating the weight matrix online using one or more additional bad input vectors.

10. A programmable logic unit comprising:
 a plurality of interconnected hardware blocks, at least one of said hardware blocks being a faulty hardware block;
 a feedforward linear associative memory (LAM) neural network checking circuit which classifies input vectors to said faulty hardware block as either good or not good;
 a software work-around input; and
 a selection circuit connected to said feedforward LAM neural network checking circuit, for (i) blocking an output vector of the faulty hardware block corresponding to a new input vector, (ii) enabling a software work-around for the new input vector, and (iii) accepting an output vector from said software work-around input corresponding to the new input vector, as an output vector of the programmable logic circuit.

11. The programmable logic unit of claim 10 wherein said selection circuit includes:
 a software work-around enable signal output of said feedforward LAM neural network checking circuit; and
 a multiplexer having two inputs respectively receiving the output vector from said faulty hardware block and the output vector from said software work-around, and a select line which is connected to said software work-around enable signal output of said feedforward LAM neural network checking circuit.

12. The programmable logic unit of claim 10 wherein said feedforward LAM neural network checking circuit has a weight matrix whose elements are based on a set of known bad input vectors for said faulty hardware block.

13. The programmable logic unit of claim 12 wherein said feedforward LAM neural network checking circuit updates the weight matrix online using one or more additional bad input vectors.

14. The programmable logic unit of claim 13 wherein said feedforward LAM neural network checking circuit includes:
 an SRAM array;
 a content-addressable memory for storing the known bad input vectors; and address management means for using said SRAM to update both said content-addressable memory and said weight matrix.

15. The programmable logic unit of claim 12 wherein the weight matrix W in said feedforward LAM neural network checking circuit is calculated according to the equation $$w_{ij} = \sum_{m=1}^{M} (2a_i^{(m)} - 1)(2b_j^{(m)} - 1)$$

where $a^{(m)}$ is the set of known bad vectors, $a_i = b_j$, M is the number of bad input vectors in the set of known bad input vectors, i is a row locator representing a particular bad vector, and j is a column locator representing a bit location.

16. The programmable logic unit of claim 15 wherein said feedforward LAM neural network checking circuit includes:
means for calculating an output vector $a^{(m)}$ by multiplying the weight matrix W by the new input vector $b^{(m)}$, that is, $a^{(m)} = Wb^{(m)}$;
means for adjusting elements of the output vector $a^{(m)}$ by its respective thresholds $\theta_i$ according to the equation $$\theta i = -1/2 \sum_{j=1}^{K} w_{ij}$$

where K is the total number of bits in a vector; and
a plurality of non-linear units which process respective elements of the weight matrix to provide an output of 1 when a given adjusted element is positive, and provide an output of 0 when a given adjusted element is not positive.

17. The programmable logic unit of claim 16 wherein said feedforward LAM neural network checking circuit matches a vector constructed of the outputs of said non-linear units with an entry in a content-addressable memory storing the set of known bad vectors.

18. The programmable logic unit of claim 10 wherein said feedforward LAM neural network checking circuit classifies input vectors to said faulty hardware block as either good or not good prior to said faulty hardware generating its output vector corresponding to the new input vector.

19. The programmable logic unit of claim 10 wherein said feedforward LAM neural network checking circuit is physically located in a re-configurable hardware redundancy block.

* * * * *